United States Patent
Ma et al.

(10) Patent No.: US 7,165,988 B2
(45) Date of Patent: Jan. 23, 2007

(54) PICK UP CAP FOR LGA CONNECTOR ASSEMBLY

(75) Inventors: Hao-Yun Ma, Tu-Chen (TW); Fang-Jwu Liao, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/025,170

(22) Filed: Dec. 28, 2004

(65) Prior Publication Data
US 2005/0153581 A1 Jul. 14, 2005

(30) Foreign Application Priority Data
Jan. 8, 2004 (CH) .................. 2004 2 0024154

(51) Int. Cl.
*H01R 13/62* (2006.01)
(52) U.S. Cl. .................. 439/331; 439/940; 439/135
(58) Field of Classification Search ............... 439/135, 439/331, 940, 41
See application file for complete search history.

(56) References Cited

U.S. PATENT DOCUMENTS 4,504,105 A * 3/1985 Barkus et al. ............. 439/331

* cited by examiner

*Primary Examiner*—Javaid H. Nasri
(74) *Attorney, Agent, or Firm*—Wei Te Chung

(57) ABSTRACT

A pick up cap for an LGA connector, the connector has a housing which defines a multiplicity of passageways, a plurality of electrical contacts received in the passageways, a metal clip and a pick up cap. The clip defines a rectangular window in the middle thereof. Around the window there are two opposite sidepieces and two opposite urging sides. The pick up cap is detachably mounted on the clip. The pick up cap has a rectangular planar body which defines two opposite end portions and two opposite side portions. Each of the two side portions has a waist. When the pick up cap is mounted on the clip, two end portions engage with two opposite sidepieces, two opposite sidepieces and two opposite end portions cooperatively define two rifts therebetween.

11 Claims, 4 Drawing Sheets

PICK UP CAP FOR LGA CONNECTOR ASSEMBLY

BACKGROUND OF THE INVENTION

1. Field of the Invention

The present invention relates to a land grid array (LGA) connector assembly which has an LGA connector and a pick up cap being mounted to the connector for provision of a smooth flat top surface for being sucked by a vacuum suction device, thereby facilitating mounting the LGA connector assembly onto a substrate circuit such as a printed circuit board (PCB).

2. Description of the Prior Art

On many mass production lines, vacuum suction technology widely are used in processes of mechanical assembly. A typical process is: mounting a pick up cap onto an electronic component such as an LGA connector, using a vacuum suction device to suck the pick up cap and position it to a predetermined position on a substrate circuit with tin pre-attached in advance. The substrate circuit can be a printed circuit board PCB. When the LGA connector is positioned on the predetermined position, an infrared emitter is used to heat up the tin on the PCB to melt. Then the connector and the PCB are cooled down naturally for surely soldering the connector to the PCB.

However, with regard to the LGA connector whose passageways are centralized and dense, the soldering process is prone to be difficult. FIG. 5 illustrates a conventional LGA connector 8 for electrically connecting a CPU to a PCB, which has an insulative housing with a plurality of passageways (now shown) therein, a corresponding number of contacts received in the passageways, a metal stiffener 81 partly covering the housing to enforce the housing, a lever 83 pivotably attached to an end of the stiffener 81, and a metal clip 82 pivotably mounted onto an opposite end of the stiffener 81.

When the LGA connector 8 is to be mounted onto a PCB, first mounting a pick up cap 9 on the connector 8, then using a vacuum suction device to suck the top surface of the pick up cap 9 and put the connector 8 onto a predetermined position in the PCB. When the LGA connector 8 is positioned on the predetermined position in the PCB, using an infrared emitter to heat up the tin between the contacts and the PCB to melt, then let the connector 8 and the PCB cold down naturally for surely soldering the connector 8 onto the PCB.

However, due to the LGA connector's large dimension and square shape, its matching pick up cap 9 needs to be large accordingly. After the pick up cap 9 being assembled onto the LGA connector 8, there are many passageways (not shown) covered by the pick up cap, while the infrared emitter is heating up the tin between the contacts of the BTB connector and the PCB, the tin can not be heated evenly, this will certainly decrease the reliability of the soldering connection between the contacts of the LGA connector and the PCB.

Therefore, a new pick up cap that overcome above-mentioned disadvantages is desired.

SUMMARY OF THE INVENTION

Accordingly, an objective of the present invention is to provide a pick up cap for an LGA connector assembly, wherein when the connector is soldering to a PCB with a infrared emitter, the pick up cap can guarantee that the tin between the contacts of the LGA connector and the PCB heated evenly.

To achieve the above-mentioned objective, an LGA connector assembly in accordance with a preferred embodiment of the invention comprises an LGA connector and a pick up cap. The connector has an insulative housing which defines a multiplicity of passageways, a corresponding number of electrical contacts received in the passageways, and a metal clip. The housing defines a generally rectangular cavity for receiving an electronic package such as CPU therein. The clip is disposed on the housing to press the CPU upon the contacts. The clip defines a rectangular window in the middle thereof. Around the window there are two opposite sidepieces and two opposite urging sides. A pick up cap is detachably mounted on the clip. The pick up cap has a rectangular planar body which defines two opposite end portions and two opposite side portions, each of the two side portions has a recess. When the pick up cap is mounted on the clip, the two end portions engage with two opposite sidepieces, and there defines two rifts between two urging sides and two side portions, then use a vacuum suction device to suck the top surface of the pick up cap and put the connector to a predetermined position in the PCB. Because each of the two opposite side portions has a recess and there are two rifts between the side portions and urging sides. When using an infrared emitter, from an upper position, to heat up the tin under the passageways for soldering the connector onto the PCB, heat air can easily go through the recesses and the rifts between the side portions and urging sides, and then through the passageways to reach the tin under the passageways, in this way, the tin can be heated up evenly, therefore, a reliable soldering connection between the connector and the PCB can be achieved.

Other objectives, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
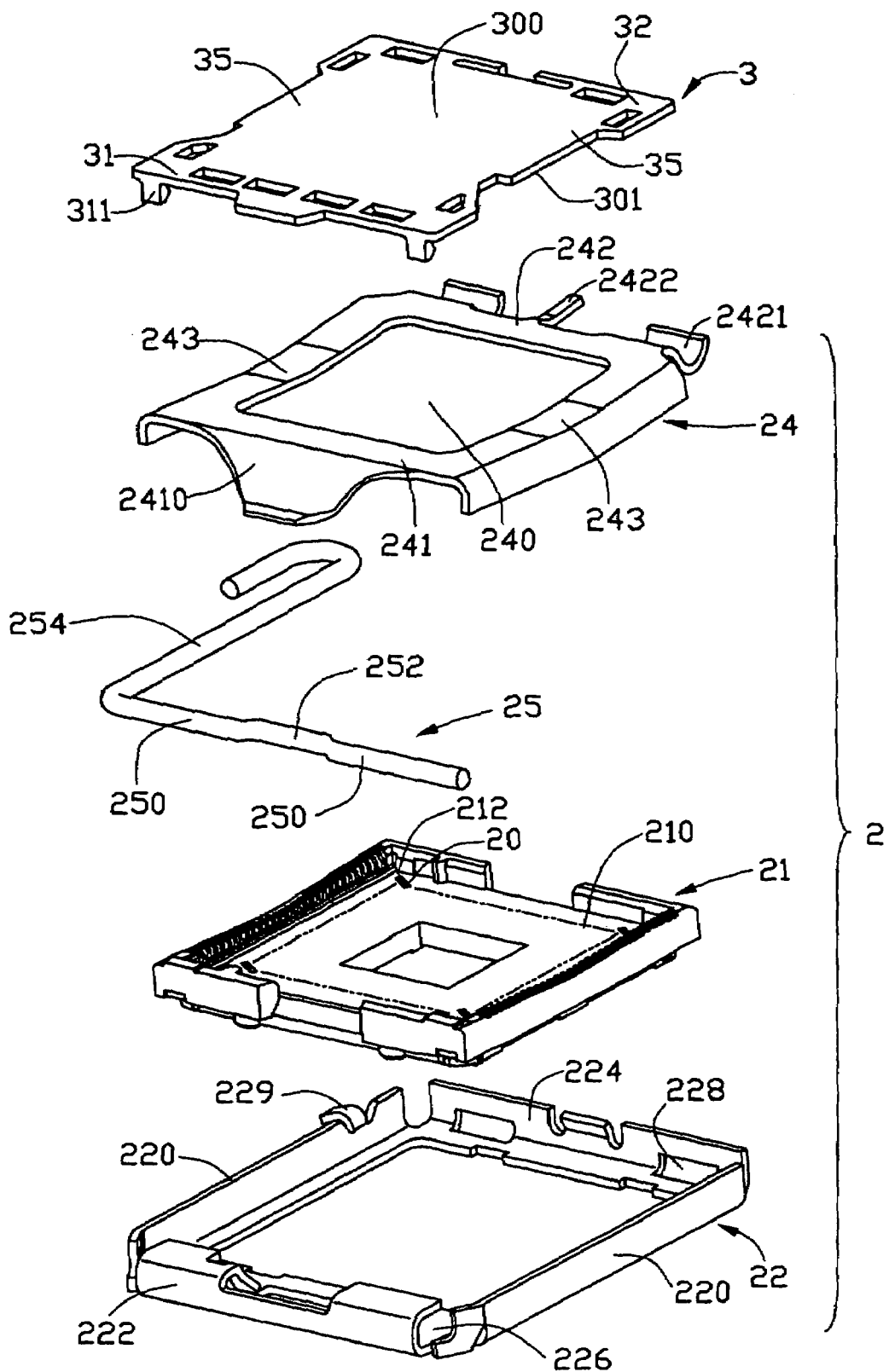
FIG. 1 is an exploded, isometric view of an LGA connector assembly of the present invention, the LGA connector assembly having an LGA connector and a pick up cap to be mounted onto the connector.

FIG. 1 shows an exploded, isometric view of an LGA connector assembly in accordance with a preferred embodiment of the present invention. The LGA connector assembly has an LGA connector 2 and a generally rectangular pick up cap 3. The pick up cap 3 can be pre-attached on the connector 2 for provision of a flat top surface 300 to be sucked by a vacuum suction device, thereby facilitating manipulating the LGA connector assembly onto a predetermined position in the PCB (not shown).

The connector 2 has an insulative housing 21 which defines a generally rectangular cavity 210 in a middle thereof. The cavity 210 is used for receiving an electronic package such as an CPU (not shown) therein. A multiplicity of passageways 212 is defined under the cavity 210, the passageways 212 receiving a corresponding number of contacts 20 therein. A metal stiffener 22 partly covers the housing 21 to enforce the housing 21, a lever 25 pivotably is received in an end of the stiffener 22, and a metal clip 24 is pivotably mounted onto an opposite end of the stiffener 22. During rotating, the lever 25 can press downwardly upon the metal clip 24.

The stiffener 22 has a pair of L-shaped cross-sectional lateral sides 220, and a U-shaped cross-sectional front end 222 and an L-shaped cross-sectional rear end 224 interconnecting two opposite ends of the lateral sides 220 respectively. The housing 21 is received in a middle portion of the stiffener 22. An elongate chamber 226 is defined in an end of the stiffener 22, a pair of spaced slots 228 is defined in another end of the stiffener 22. An ear 229 extends bendly and laterally from an edge of one L-shaped cross-sectional lateral sides 220. The lever 25 has a pair of locating portions 250 pivotably received in the chamber 226 of the stiffener 22, an actuating portion 252 between the locating portions 250, and an operating portion 254 extending perpendicularly from an end of one of the locating portions 250. The operating portion 254 is disposed at an outside of the stiffener 22, and engages with the ear 229 when the operating portion 254 is oriented at a horizontal position.

The clip 24 defines two opposite sidepieces 241, 242 and two opposite urging sides 243 interconnecting the two sidepieces 241, 242. Two opposite sidepieces 241, 242 together with two opposite urging sides 243 exclosure a rectangular window 240. The middle portions of the two opposite urging sides 243 bend downwardly. The clip 24 has an engaging portion 2410 extending arcuately from the front sidepiece 241 thereof. A pair of spaced securing portions 2421 extending arcuately from the rear sidepiece 242 thereof, corresponding to the slots 228 of the stiffener 22, and a tail 2422 between the securing portions 2421. The securing portions 2421 are pivotably received in the slots 228 of the stiffener 22. When the operating portion 254 is being rotated towards the ear 229, the actuating portion 252 urges the engaging portion 2410 of the clip 24, then the middle portion of the urging sides 243 will urge CPU to engage with the contacts of the connector. When the clip 24 is oriented at a position perpendicular to the top portion of the housing 21, the tail 244 abuts against the stiffener 22 to prevent the clip 24 from over rotation.

Figure 2:
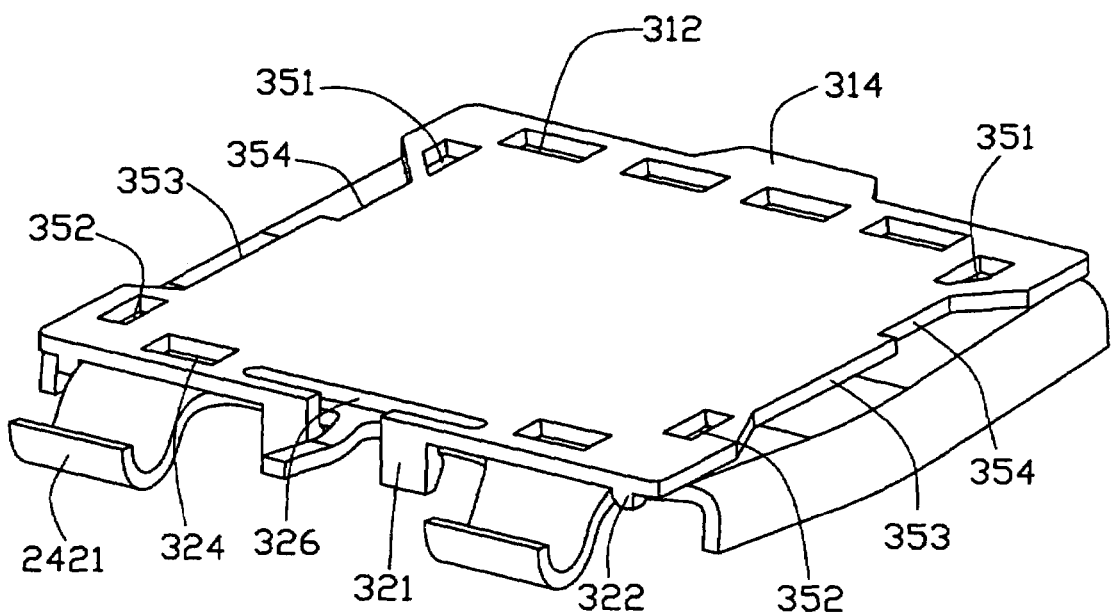
FIG. 2 is an assembled view of the pick up cap and a clip of the connector of FIG. 1, but showing from another viewing aspect.

Referring to FIG. 2 together with FIG. 1, The pick up cap 3 has a generally rectangular planar body 30 which has an approximately size of the clip 24. The planar body 30 defines a smooth flat top surface 300 and a bottom surface 301 opposite to the top surface 300. The body 30 further defines two opposite end portions 31, 32 and two opposites side portion 35 between the two ends 31, 32. A pair of first latches 311 extend downwardly from two opposite ends of the front end portion 31 respectively, a pair of second latches 321 extend separately and downwardly from a middle portion of the rear end portion 32, and a pair of clasps 322 are separately set on two opposite ends of the bottom side of the rear end portion 32.

Around of the planar body, there arranges some blowholes, in the front end portion 31 four first blowholes 312 are arranged in a line evenly, opposite to the first blowholes 312, two second blowholes 324 are arranged in the rear end portion 32. A pair of third blowholes 351 are separately arranged in the ends of two opposite side portions 35 respectively, opposite to the third blowholes 351. A pair of fourth blowholes 352 are arranged in the other ends of two opposite side portions 35 respectively. Between the two second latches 321 there forms a "T" shaped groove 326 which can make the two second latches 321 more flexible. Opposite to the groove 326, an extending portion 314 which can be used to remove the pick up cap 3 away from the connector 2 extends from a middle portion of the front end portion 31. Each of the two opposite side portions 35 has a waist 353 in middle portions thereof. The waists 353 sunken introvertedly. With the two first waists 353, the width of the pick up cap at the middle portion is smaller than the width at its two ends. Each of the two waists 353 has a recess, the two recesses 354 are near to the third blowholes 351 and opposite to each other.

Figure 3:
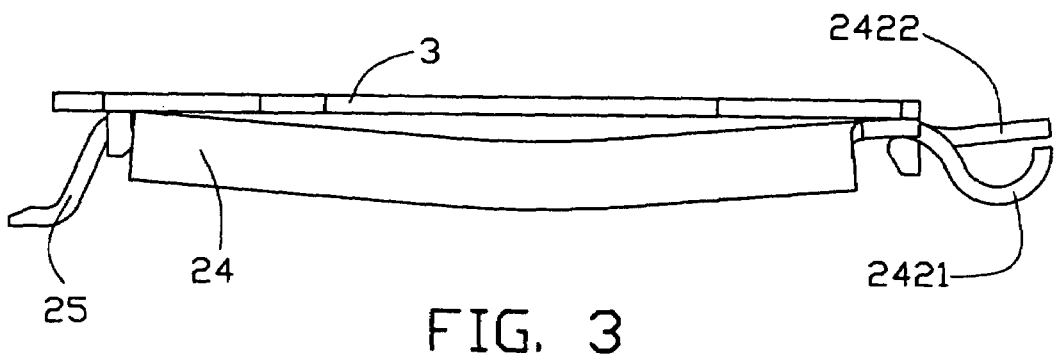
FIG. 3 is a side view of the pickup cap and a clip of the connector of FIG. 2.

Referring to FIGS. 2 and 3, in the course of attaching of the pick up cap 3 onto the connector 2, the pick up cap 3 is disposed over the connector 2, with the first latches 311 and second latches 321 loosely contacting corresponding out sides of the opposite sidepieces 241, 242 of the clip 24 respectively. When the pick up cap 3 is pressed down, the first latches 311 and second latches 321 are elastically deflected and snap the corresponding out sides of two opposite sidepieces 241, 242, and at the same time, two latches 322 respectively snap the two sides of the engaging portion 2410.

Figure 4:
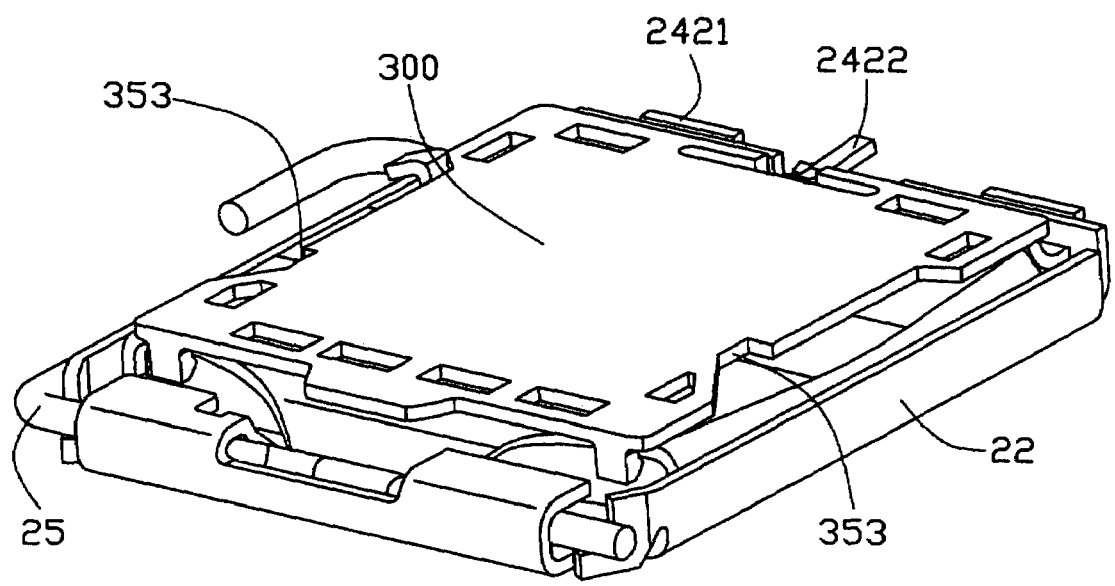
FIG. 4 is an assembled, isometric view of the LGA connector assembly of FIG. 1.
Figure 5:
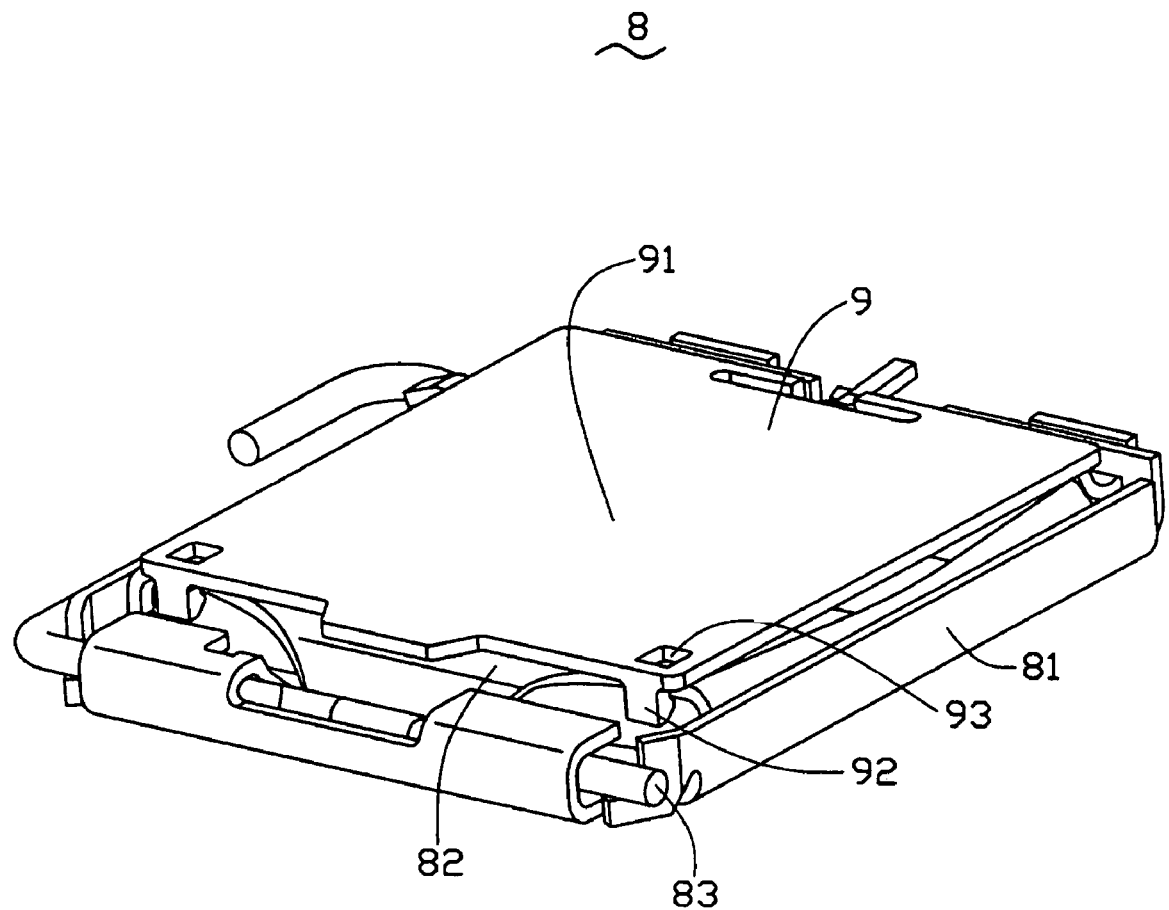
FIG. 5 is an assembled, isometric view of a conventional LGA connector assembly.

Referring to FIG. 4, when the pick up cap 3 is mounted on the connector 2, two opposite end portions 31, 32 engage with two opposite sidepieces 241, 242 respectively. Between the side portions 35 and urging sides 243, there defines two rifts because of the urging sides 234 bending downwardly. Use a vacuum suction device to suck the top surface 300 of the pick up cap 3 and put the connector 2 to a predetermined position in the PCB. Make reference to FIG. 2. Because each of the two opposite side portions has a waist 353, which makes the width of the pick up cap 3 in its middle portion to be smaller than the width in its two ends, so the outer part of the middle portions of the urging sides can not be covered by the pick up cap 3. When using a infrared emitter, from a upper position, to heat up the tin under the passageways for soldering the connector 2 onto the PCB, it is easier for a large amount of heat easily pass through rifts between the side portions 35 and urging sides 243, because the two side portions 35 no longer covered the two urging portions 243 completely as the prior art with the two waists 353 set on the two side portions 35 and the two recesses 354 set on two waists 353. When the hot air has passed the rifts, it goes on to pass through the passageways to reach the tin under the passageways. In this way, the tin can be heated evenly. Therefore, a reliable soldering between the connector and the PCB can be achieved.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An LGA connector assembly comprising:
   an LGA connector comprising:
   an insulative housing for receiving an electronic package therein:

a clip disposed on the housing, said clip defining a middle cavity and two opposite urging sides at two opposite sides of the cavity, the two urging sides extending along a front-to-back direction and bending downwardly in the middle therefrom;

a pick up cap detachably mounted on the clip, the pick up cap having a planar body which defines two opposite side portions extending along the front-to-back direction, wherein at least one side portion has a waist in the middle portion, which makes the pick up cap to be narrow at the middle portion.

2. The LGA connector assembly as claimed in claim 1, wherein the clip defines two opposite sidepieces at other two opposite sides of the cavity, the planar body of pick up cap defines two end portions at the other two opposite sides thereof, the waist has recess near to a end portion of the pick up cap.

3. The LGA connector assembly as claimed in claim 1, wherein a pair of first latches extend downwardly from two opposite ends of one end portion of the pick up cap respectively, a pair of second latches extend separately and downwardly from a middle portion of the other end portion of the pick up cap.

4. The LGA connector assembly as claimed in claim 3, wherein a groove is formed between the two latches to make the latches to be more flexible.

5. The LGA connector assembly as claimed in claim 4, wherein four first blowholes are arranged evenly in one end portion, and opposite to the first blowholes, there are two apposite second blowholes arranged in the other end portion.

6. An LGA connector assembly comprising:
an LGA connector comprising:
an insulative housing for receiving an electronic package therein;
a clip pivotally mounted on the housing and defining a concave in a middle section along a front-to-back direction;
a pick up cap detachably mounted on the clip, the pick up cap having a body defining a large width at two opposite lengthwise ends in said front-to-back direction and a small width at a middle portion in said front-to-back direction to cooperate with said concave for facilitating heat dissipation.

7. The LGA connector assembly as claimed in claim 6, wherein the width of said pick up cap at the lengthwise end is similar to that of clip thereabouts.

8. The LGA connector assembly as claimed in claim 6, wherein said clip defines a central opening, and an edge of said pick up cap around said middle portion is essentially vertically aligned with another edge defined by said central open to maximize the heat dissipation.

9. The LGA connector assembly as claimed in claim 6, wherein a plurality of blowholes are formed around a periphery area of the pick up cap.

10. The LGA Connector assembly as claimed in claim 9, wherein said clip defines a central opening, and said blowholes are outwardly offset from said central opening.

11. An electrical connector comprising an insulative housing, a metal clip disposed on the housing, said clip defining a window in the middle and two opposite urging sides at two opposite sides of the window, a pick up cap comprising: a planar body defining a pair of opposite end portions and a pair of opposite side portions; a plurality of latches extending from the end portions; wherein at least one of the side portions defines a waist region in a middle portion thereof; wherein each of said urging sides defines an upward concave in a middle section thereof, and said waist region is offset from and upwardly expose the corresponding upward concave so as to facilitate heat dissipation.

* * * * *